(12) United States Patent
Narita (10) Patent No.: US 10,347,471 B2
(45) Date of Patent: Jul. 9, 2019

(54) NBO2 SINTERED COMPACT, SPUTTERING TARGET COMPRISING THE SINTERED COMPACT, AND METHOD OF PRODUCING NBO2 SINTERED COMPACT

(71) Applicant: JX Nippon Mining & Metals Corporation, Tokyo (JP)

(72) Inventor: Satoyasu Narita, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 227 days.

(21) Appl. No.: 14/424,586

(22) PCT Filed: Nov. 8, 2013

(86) PCT No.: PCT/JP2013/080233
§ 371 (c)(1),
(2) Date: Feb. 27, 2015

(87) PCT Pub. No.: WO2014/077198
PCT Pub. Date: May 22, 2014

(65) Prior Publication Data
US 2015/0255260 A1 Sep. 10, 2015

(30) Foreign Application Priority Data
Nov. 13, 2012 (JP) ................. 2012-249181

(51) Int. Cl.
*H01J 37/34* (2006.01)
*C23C 14/34* (2006.01)
(Continued)

(52) U.S. Cl.
CPC .......... *H01J 37/3426* (2013.01); *C01G 33/00* (2013.01); *C04B 35/495* (2013.01);
(Continued)

(58) Field of Classification Search
CPC ............... H01J 37/3426; H01J 37/3429; H01J 37/3435; H01J 37/3491; C23C 14/3414;
(Continued)

(56) References Cited

U.S. PATENT DOCUMENTS 6,528,442 B1 3/2003 Kuwano et al.
7,157,073 B2 1/2007 Motchenbacher et al.
(Continued)

FOREIGN PATENT DOCUMENTS

CN 101209927 A 7/2008
CN 101864555 A * 10/2010
(Continued)

OTHER PUBLICATIONS

J.M. Gallego, C.B. Thomas, Preparation and characterization of thin films of NbO2, Thin Solid Films, vol. 98, Issue 1, 1982, pp. 11-22.*
(Continued)

*Primary Examiner* — Michael A Band
(74) *Attorney, Agent, or Firm* — Howson & Howson LLP (57) ABSTRACT

The present invention relates to a $NbO_2$ sintered compact characterized in that the intensity proportion of the X-ray diffraction peak intensity of a (001) plane or (110) plane of $Nb_2O_5$ relative to the X-ray diffraction peak intensity of a (400) plane of $NbO_2$ is 1% or less. The present invention provides, without using an expensive $NbO_2$ material, a $NbO_2$ sintered compact that can be applied to a sputtering target for forming a high-quality variable resistance layer for a ReRAM. In particular, it is an object of the present invention to provide a single phase $NbO_2$ sintered compact having a high density suitable for stabilizing sputtering.

13 Claims, 5 Drawing Sheets

(51) Int. Cl.
  *C23C 14/08* (2006.01)
  *C04B 35/495* (2006.01)
  *C04B 35/645* (2006.01)
  *C04B 37/02* (2006.01)
  *C01G 33/00* (2006.01)

(52) U.S. Cl.
  CPC .......... *C04B 35/645* (2013.01); *C04B 37/026* (2013.01); *C23C 14/083* (2013.01); *C23C 14/3414* (2013.01); *H01J 37/3435* (2013.01); *H01J 37/3491* (2013.01); *C01P 2002/72* (2013.01); *C01P 2002/74* (2013.01); *C01P 2004/03* (2013.01); *C01P 2004/61* (2013.01); *C01P 2006/10* (2013.01); *C04B 2235/3251* (2013.01); *C04B 2235/404* (2013.01); *C04B 2235/77* (2013.01); *C04B 2235/79* (2013.01); *C04B 2237/12* (2013.01); *C04B 2237/407* (2013.01)

(58) Field of Classification Search
  CPC ... C23C 14/083; C04B 35/495; C04B 35/645; C04B 37/026
  See application file for complete search history.

(56) References Cited

U.S. PATENT DOCUMENTS

| | | |
|---|---|---|
| 7,341,705 B2 | 3/2008 | Schnitter |
| 8,758,497 B2 | 6/2014 | Takami et al. |
| 2007/0045694 A1 | 3/2007 | Hsu |
| 2011/0155561 A1 | 6/2011 | Otani et al. |
| 2012/0199796 A1 | 8/2012 | Ikisawa et al. |

FOREIGN PATENT DOCUMENTS

| | | | |
|---|---|---|---|
| JP | 2002-338354 A | | 11/2002 |
| JP | 2004059965 A | * | 2/2004 |
| JP | 2011-071380 A | | 4/2011 |
| JP | 2012-158493 A | | 8/2012 |

OTHER PUBLICATIONS

Machine Translation of JP2004-059965 A.*
CN101864555 Machine Translation (Year: 2010).*

* cited by examiner

NBO2 SINTERED COMPACT, SPUTTERING TARGET COMPRISING THE SINTERED COMPACT, AND METHOD OF PRODUCING NBO2 SINTERED COMPACT

BACKGROUND

The present invention relates to a niobium dioxide ($NbO_2$) sintered compact, a sputtering target manufactured from the sintered compact, and a method of producing a $NbO_2$ sintered compact.

In recent years, a resistive random access memory (ReRAM) has attracted attention as an alternative of flash memories. The ReRAM utilizes a large change in electric resistance by voltage application and is known to have a variable resistance layer made of an oxide of a transition metal, such as nickel, titanium, tantalum, or niobium, in particular, an oxide (suboxide) having a composition shifting stoichiometrically (see Patent Literatures 1 to 3). For example, Patent Literature 1 discloses niobium oxide ($Nb_2O_5$) as a variable resistance layer provided in an ReRAM.

A thin film of niobium oxide is usually formed by sputtering. For example, Patent Literature 4, although it is an example of niobium pentoxide, discloses a sputtering target of niobium oxide produced by pressure sintering, such as hot pressing, of a niobium oxide powder.

Meanwhile, in order to most simply produce a sintered compact for a target, the composition of raw materials is adjusted to the intended composition of the sintered compact. If a raw material is expensive, even if the method is simple, the cost is increased to cause a disadvantage from the viewpoint of productivity.

Accordingly, it is known to inexpensively produce a sintered compact by reaction sintering (method of simultaneously performing synthesis and sintering) by using an inexpensive substitute for the expensive raw material. However, in production of a $NbO_2$ sintered compact by applying this method to an expensive material, niobium dioxide ($NbO_2$), for producing by reaction sintering of a $Nb_2O_5$ powder and a Nb powder, there occurs problems such as remaining of unreacted raw materials and formation of a large number of small pores in the sintered compact. In addition, the production of a large-sized sintered compact involves a problem of an ununiform in-plane density of the sintered compact.

Patent Literature 1: Japanese Patent Laid-Open No. 2011-149091
Patent Literature 2: Japanese Patent Laid-Open No. 2011-71380
Patent Literature 3: Japanese Patent Laid-Open No. 2007-67402
Patent Literature 4: Japanese Patent Laid-Open No. 2002-338354

SUMMARY OF INVENTION

Summary

The present invention provides a $NbO_2$ sintered compact that can be used as a sputtering target and a method of producing the $NbO_2$ sintered compact without using expensive $NbO_2$.

Accordingly, the present inventors have diligently studied for solving the above-described problems and, as a result, have found that a $NbO_2$ sintered compact that can be used as a sputtering target, in particular, a $NbO_2$ single phase sintered compact having a high density for a sputtering target, can be produced by synthesizing $NbO_2$ in advance from raw materials, $Nb_2O_5$ and Nb, and subjecting it to sintering.

On the basis of these findings, the present invention provides:

1) A $NbO_2$ sintered compact, wherein an intensity proportion of the X-ray diffraction peak intensity of a (001) plane or (110) plane of $Nb_2O_5$ relative to the X-ray diffraction peak intensity of a (400) plane of $NbO_2$ is 1% or less;
2) The $NbO_2$ sintered compact according to 1), wherein the intensity proportion of the X-ray diffraction peak intensity of a (110) plane of Nb relative to the X-ray diffraction peak intensity of a (400) plane of $NbO_2$ is 1% or less;
3) The $NbO_2$ sintered compact according to 1) or 2), wherein the intensity proportion of the X-ray diffraction peak intensity of a (400) plane of $Nb_{12}O_{29}$ relative to the X-ray diffraction peak intensity of a (400) plane of $NbO_2$ is 5% or less;
4) The $NbO_2$ sintered compact according to any one of 1) to 3), having a relative density of 95% or more;
5) The $NbO_2$ sintered compact according to any one of 1) to 4), wherein the density variation between arbitrary points in a plane of the sintered compact is 1.0% or less;
6) The $NbO_2$ sintered compact according to any one of 1) to 5), having a diameter of 110 mm or more;
7) A sputtering target manufactured from the $NbO_2$ sintered compact according to any one of 1) to 6);
8) The sputtering target according to 7), having resistivity on a surface of 100 m$\Omega$·cm or less;
9) The sputtering target according to 7) or 8), wherein the sputtering target is bonded to a backing plate made of oxygen-free copper, chromated copper, or zincated copper with an indium solder;
10) A method of producing a $NbO_2$ sintered compact comprising:
mixing a $Nb_2O_5$ powder and a Nb powder;
heating the resulting mixture at 1300° C. to 1400° C. in vacuum or in an inert atmosphere to synthesize $NbO_2$;
pulverizing the synthesized $NbO_2$; and
sintering the pulverized powder by hot pressing at 950° C. to 1300° C.;
11) The method of producing a $NbO_2$ sintered compact according to 10), wherein the pulverized powder of the synthesized $NbO_2$ is sintered by hot pressing at 950° C. to 1100° C.;
12) The method of producing a $NbO_2$ sintered compact according to 10) or 11), wherein the $Nb_2O_5$ powder has a purity of 99.9% or more, and the Nb powder has a purity of 99.9% or more; and
13) The method of producing a $NbO_2$ sintered compact according to any one of 10) to 12), wherein the $Nb_2O_5$ powder has an orthorhombic or monoclinic crystal system.

According to the present invention, a $NbO_2$ sintered compact composed of $NbO_2$ synthesized from $Nb_2O_5$ and $NbO_2$ can be obtained. In particular, the present invention can provide a $NbO_2$ single phase sintered compact having a high density. Accordingly, the present invention has an effect that a sputtering target obtained by machining such a sintered compact does not cause abnormal discharge during sputtering to reduce occurrence of particles and achieve stable sputtering and can form a high-quality $NbO_2$ thin film. In addition, the present invention has an excellent effect of providing a sputtering target having a high density in response to a recent demand for large-sized sputtering targets.

DETAILED DESCRIPTION

The present invention uses inexpensive materials, $Nb_2O_5$ and Nb, instead of the use of expensive $NbO_2$ and thereby can significantly reduce the manufacturing cost. The present invention can also provide a $NbO_2$ sintered compact having excellent characteristics that can be used in a sputtering target by being produced by synthesizing $NbO_2$ in advance from raw materials, $Nb_2O_5$ and Nb, and subjecting it to sintering.

The $NbO_2$ sintered compact of the present invention is substantially composed of a $NbO_2$ single phase. As described above, in production of a $NbO_2$ sintered compact from $Nb_2O_5$ and Nb by a common method, reaction sintering (a method simultaneously performing synthesis and sintering), complete synthesis cannot be achieved even if the conditions such as sintering temperature are controlled, and unreacted materials such as $Nb_{12}O_{29}$ shown in Comparative Examples below remain to form a plurality of phases in some cases. In the present invention, however, since $NbO_2$ is completely synthesized in advance from $Nb_2O_5$ and Nb and is then subjected to sintering, a sintered compact that is substantially a $NbO_2$ single phase can be produced. A sputtering target of such a sintered compact can stably form a $NbO_2$ thin film.

The $NbO_2$ sintered compact of the present invention is characterized in that the intensity proportion of the X-ray diffraction peak intensity of a (110) plane of $Nb_2O_5$ relative to the X-ray diffraction peak intensity of a (400) plane of $NbO_2$ is 1% or less. In addition, the intensity proportion of the X-ray diffraction peak intensity of a (110) plane of Nb is preferably 1% or less, and the intensity proportion of the X-ray diffraction peak intensity of a (400) plane of $Nb_{12}O_{29}$ is more preferably 5% or less. When the intensity proportions of the X-ray diffraction peak intensities of $NbO_2$, Nb, and $Nb_{12}O_{29}$ relative to the X-ray diffraction peak intensity of a (400) plane of $NbO_2$ are respectively 1% or less, 1% or less, and 5% or less, the sputtering target can perform stable sputtering that is substantially the same as that by a single phase $NbO_2$ target.

The $NbO_2$ sintered compact of the present invention has a high relative density of 95% or more. Accordingly, a sputtering target produced by machining the sintered compact does not cause abnormal discharge during sputtering to achieve stable sputtering and can form a high-quality thin film with reduced occurrence of particles.

In the present invention, the density variation between arbitrary points in a plane of the sintered compact can be reduced to 1.0% or less, preferably 0.5% or less, and more preferably 0.2% or less. The density variation is determined from relative densities at two arbitrary points in a plane of a sintered compact by the formula: {(higher relative density)/(lower relative density)−1}×100(%).

Since sintering of synthesized $NbO_2$ by hot pressing generates a portion partially having pores, it is believed that gas occurs during the hot pressing. It is believed that this occurrence of gas causes a gentle bulge in the thickness direction from the edge to the center of the target to cause a large difference in density in a plane. In production of a large-sized sintered compact, this causes a warp or cracking in the sintered compact. Therefore, the present invention is particularly effective in production of a large-sized sintered compact.

The present invention exhibits an excellent effect on, in particular, a large-sized $NbO_2$ sintered compact having a diameter of 110 mm or more, furthermore, a diameter of 460 mm or more. As described above, in production of a large-sized sintered compact, there is a risk of causing a change in the shape of the sintered compact, unlike production of a small-sized sintered compact. That is, in a sintered compact having a diameter of smaller than 110 mm, conditions set for hot pressing of a small-sized sample can be directly applied to production of the sintered compact. However, in a sintered compact having a diameter of 110 mm or more, if the conditions for hot pressing determined using a small-sized sample are directly applied to production of the sintered compact, changes in, for example, the shape of the sintered compact occur, resulting in a difficulty in producing a sintered compact having a high density. However, the sintered compact of the present invention does not have an upper limit in size, and from the viewpoint of manufacturing, a diameter up to about 480 mm is preferred.

The $NbO_2$ sintered compact of the present invention can be produced by, for example, as follows. The present invention is characterized in that since a commercially available $NbO_2$ powder is expensive and takes a lot of time to obtain, inexpensive $Nb_2O_5$ powder and Nb powder are used.

First, an orthorhombic or monoclinic crystal $Nb_2O_5$ powder having a purity of 99.9% and a Nb powder having a purity of 99.9% are prepared. These powders are mixed and are then subjected to heat treatment for synthesis. The temperature of the heat treatment can be appropriately determined while confirming the state of the synthesis and is preferably 1200° C. to 1400° C. in vacuum or in an inert atmosphere. A heat treatment at lower than 1200° C. disadvantageously causes remaining of Nb and synthetic intermediates due to, for example, insufficient mixing. The temperature of the heat treatment is preferably higher than 1200° C., more preferably higher than 1300° C., and is preferably 1400° C. or lower from the viewpoint of the facilities and productivity.

Subsequently, the synthesized $NbO_2$ powder is sintered by hot pressing. The synthesized $NbO_2$ powder is coarse and is pulverized before sintering. The pulverization can be performed by a known method. For example, a jet mill or SC mill can be used, and the grain size after pulverization is preferably 0.1 to 10.0 μm.

On this occasion, the hot-pressing sintering temperature is adjusted to 950° C. to 1300° C. (except 1300° C.). Generally, a higher temperature tends to increase the relative density. In the case of the $NbO_2$ powder, however, since a sintering temperature of 1300° C. or higher may cause cracking in the sintered compact due to the emission gas during the sintering, the upper limit of the sintering temperature is lower than 1300° C. The lower limit of the sintering temperature is 950° C., because thermomechanical analysis (TMA) demonstrates that a temperature of lower than 950° C. cannot provide monotonous contraction. In a case of a large-sized sintered compact, in particular, in a case of a sintered compact having a diameter of 110 mm or more, the hot-pressing sintering temperature is preferably 950° C. to 1100° C. If the sintering temperature is higher than 1100° C., the emission gas during the sintering reduces the density of the sintered compact and generates a difference in the density between an arbitrary point in the periphery (within 30 mm from the edge) and the central portion in a plane of the sintered compact, and may also cause cracking in the sintered compact itself.

Thus, a single phase $NbO_2$ sintered compact having a relative density of 95% or more can be produced. This sintered compact can be produced into a sputtering target by machining such as cutting and polishing.

EXAMPLES

The present invention will now be described by Examples and Comparative Examples. The Examples are merely exemplary and are not intended to limit the scope of the present invention. That is, the present invention is limited only by the claims and encompasses various modifications in addition to the Examples included in the present invention.

Example 1

Figure 1:
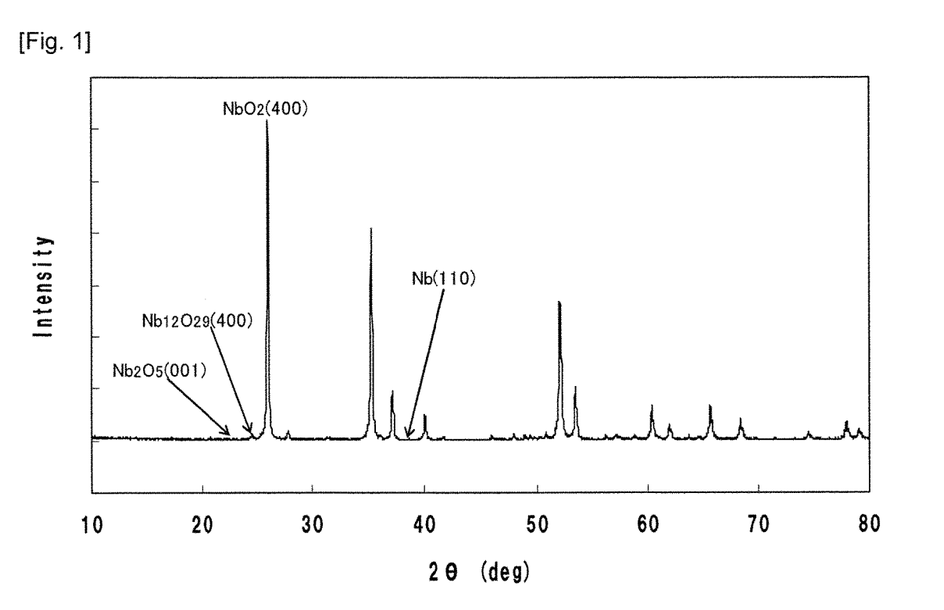
FIG. 1 is a graph showing an XRD profile of $NbO_2$ synthesized from an orthorhombic $Nb_2O_5$ powder at 1300° C.

An orthorhombic $Nb_2O_5$ powder having a purity of 99.9% and a Nb powder having a purity of 99.9% were mixed. The mixture was placed in a carbon crucible and was heated in an inert gas atmosphere. The heat treatment temperature was 1300° C., and the treatment time was 2 hours. The crystal structure of the $Nb_2O_5$ powder is not influenced by the heat treatment results, and the heat treatment time depends on the throughput and the structure of the furnace and is not limited to the above. FIG. 1 shows the result of X-ray diffraction analysis after the heat treatment synthesis. The intensity proportion of the X-ray diffraction peak intensity of a (400) plane of $Nb_{12}O_{29}$ appearing on the way of synthesis relative to the X-ray diffraction peak intensity of a (400) plane of $NbO_2$ was 1.7%; the intensity proportion of the X-ray diffraction peak intensity of a (001) plane of $Nb_2O_5$ relative to the X-ray diffraction peak intensity of a (400) plane of $NbO_2$ was 0.1% or less; and the intensity proportion of the X-ray diffraction peak intensity of a (110) plane of Nb relative to the X-ray diffraction peak intensity of a (400) plane of $NbO_2$ was 0.1%. The amount of Nb in the synthesized material measured by ICP was 74.5 wt %, against the theoretical value of 74.4 wt %, to demonstrate that $NbO_2$ was synthesized.

Subsequently, the synthesized $NbO_2$ powder was sintered by hot pressing. Since aggregation occurs during the synthesis, the powder at this point has a coarse grain size. Accordingly, the powder was pulverized with a jet mill to give a grain diameter of about 1.4 μm. The hot-pressing sintering was performed at a hot-pressing temperature of 1100° C. to provide an intended shape having a diameter of 30 mm and a thickness of 9 mm. As a result, the average relative density value was high, 96.9%. The relative density was calculated on the basis of a true density (theoretical density) of 5.9 g/cm³. Since the diameter of this sintered compact was small, 30 mm, verification of the in-plane density distribution is useless and was not performed. Table 1 shows the results.

TABLE 1

|  |  |  |  | Synthesis | | | Ratio (%) to XRD $NbO_2$ (400) | | |
| --- | --- | --- | --- | --- | --- | --- | --- | --- | --- |
|  |  | $Nb_2O_5$ powder | Nb powder | Existence | Temp. (° C.) | Time (hr) | Nb (100) | $Nb_2O_5$ (001) or $Nb_2O_5$ (110) | $Nb_{12}O_{29}$ |
| Example | 1 | orthorhombic 99.9% | 99.9% | Yes | 1300 | 2 | 0.1 | ≤0.1 | 1.7 |
|  | 2 | monoclinic 99.9% | 99.9% | Yes | 1300 | 2 | 0.3 | ≤0.1 | 4.6 |
|  | 3 | orthorhombic 99.9% | 99.9% | Yes | 1300 | 2 | 0.1 | ≤0.1 | 1.7 |
|  | 4 | orthorhombic 99.9% | 99.9% | Yes | 1300 | 2 | 0.1 | ≤0.1 | 1.7 |
|  | 5 | orthorhombic 99.9% | 99.9% | Yes | 1300 | 2 | 0.1 | ≤0.1 | 1.7 |
|  | 6 | orthorhombic 99.9% | 99.9% | Yes | 1300 | 2 | 0.1 | ≤0.1 | 1.7 |
|  | 7 | monoclinic 99.9% | 99.9% | Yes | 1300 | 2 | 0.4 | ≤0.1 | 4.6 |
| Comparative Example | 1 | orthorhombic 99.9% | 99.9% | No | — | — | 25.2 | 0.5 | 38.0 |
|  | 2 | orthorhombic 99.9% | 99.9% | No | — | — | 8.0 | 0.5 | 14.5 |
|  | 3 | orthorhombic 99.9% | 99.9% | No | — | — | 0.8 | 0.1 | 3.9 |

TABLE 1-continued

|  |  |  | | | | | | | |
|---|---|---|---|---|---|---|---|---|---|
|  | 4 | orthorhombic 99.9% | 99.9% | Yes | 1300 | 2 | 0.1 | ≤0.1 | 1.7 |
|  | 5 | orthorhombic 99.9% | 99.9% | Yes | 1300 | 2 | 0.1 | ≤0.1 | 1.7 |
|  | 6 | orthorhombic 99.9% | 99.9% | Yes | 1300 | 2 | 0.1 | ≤0.1 | 1.7 |

|  |  | Hot press | | Density | | Resistivity | |
|---|---|---|---|---|---|---|---|
|  |  | Diameter (mm) | Temp. (° C.) | Density (%) | Distribution (%) | on a surface mΩ·cm | Note |
| Example | 1 | 30 | 1100 | 96.9 | — | — |  |
|  | 2 | 30 | 1050 | 96.5 | — | — |  |
|  | 3 | 110 | 1100 | 95.8 | ≤0.2 | 37.7 | Used the powder synthesized in Example 1 |
|  | 4 | 110 | 950 | 96.6 | ≤0.2 | 1.5 | Used the powder synthesized in Example 1 |
|  | 5 | 460 | 1060 | 97.1 | ≤0.5 | 2.1 | Used the powder synthesized in Example 1 |
|  | 6 | 460 | 950 | 95.2 | ≤0.5 | — | Used the powder synthesized in Example 1 |
|  | 7 | 460 | 1050 | 96.6 | — | 2.5 | Used the powder synthesized in Example 2 |
| Comparative Example | 1 | 30 | 1000 | — | — | — |  |
|  | 2 | 30 | 1100 | — | — | — |  |
|  | 3 | 30 | 1200 | — | — | — |  |
|  | 4 | 110 | 1300 | 85.0 | 6.1 | — | Used the powder synthesized in Example 1 |
|  | 5 | 460 | 1300 | 79.5 | 3.1 | — | Used the powder synthesized in Example 1 |
|  | 6 | 110 | 900 | 88.6 | 0.9 | — | Used the powder synthesized in Example 1 |

Example 2

Figure 2:
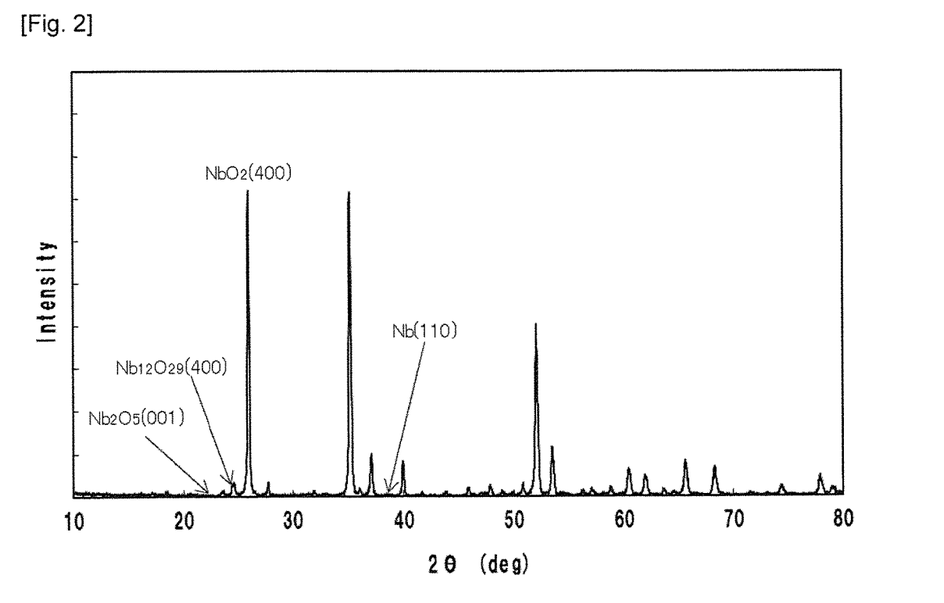
FIG. 2 is a graph showing an XRD profile of $NbO_2$ synthesized from a monoclinic $Nb_2O_5$ powder at 1300° C.

A monoclinic $Nb_2O_5$ powder having a purity of 99.9% and a Nb powder having a purity of 99.9% were mixed. The mixture was placed in a carbon crucible and was heated in vacuum. The heat treatment temperature was 1300° C., and the treatment time was 2 hours. The crystal structure of the $Nb_2O_5$ powder is not influenced by the heat treatment results, and the heat treatment time depends on the throughput and the structure of the furnace and is not limited to the above. FIG. 2 shows the result of X-ray diffraction analysis after the heat treatment synthesis. The intensity proportion of the X-ray diffraction peak intensity of a (400) plane of $Nb_{12}O_{29}$ appearing on the way of synthesis relative to the X-ray diffraction peak intensity of a (400) plane of $NbO_2$ was 4.6%; the intensity proportion of the X-ray diffraction peak intensity of a (001) plane of $Nb_2O_5$ relative to the X-ray diffraction peak intensity of a (400) plane of $NbO_2$ was 0.1% or less; and the intensity proportion of the X-ray diffraction peak intensity of a (110) plane of Nb relative to the X-ray diffraction peak intensity of a (400) plane of $NbO_2$ was 0.3%. The amount of Nb in the synthesized material measured by ICP was 74.0 wt %, against the theoretical value of 74.4 wt %, to demonstrate that $NbO_2$ was synthesized.

Subsequently, the synthesized $NbO_2$ powder was sintered by hot pressing. Since aggregation occurs during the synthesis, the powder at this point has a coarse grain size. Accordingly, the powder was pulverized with a jet mill to give a grain diameter of about 1.4 μm. The hot-pressing sintering was performed at a hot-pressing temperature of 1050° C. to provide an intended shape having a diameter of 30 mm and a thickness of 9 mm. As a result, the average relative density value was high, 96.5%. The relative density was calculated on the basis of a true density (theoretical density) of 5.9 g/cm³. Since the diameter of this sintered compact was small, 30 mm, verification of the in-plane density distribution is useless and was not performed.

Example 3

Figure 3:
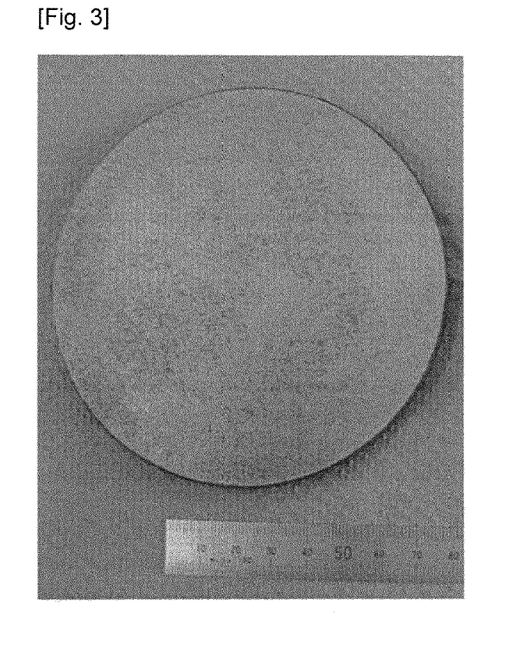
FIG. 3 is a photograph of the appearance of a sintered compact (diameter: 110 mm) of Example 3 (hot pressing at 1100° C.).

The pulverized $NbO_2$ powder obtained in Example 1 was sintered by hot pressing at 1100° C. to produce a sintered compact having a diameter of 110 mm. As a result, the average relative density value of the resulting sintered compact was high, 95.8%, to suppress the density variation in in-plane distribution to 0.2% or less. As shown in FIG. 3, no specific abnormality was observed in the appearance of the sintered compact. Furthermore, the surface of the sintered compact was ground, and the resistivity on a surface was measured by a four-terminal method and was found to be 37.7 mΩ·cm.

Example 4

The pulverized $NbO_2$ powder obtained in Example 1 was sintered by hot pressing at 950° C. to produce a sintered compact having a diameter of 110 mm. As a result, the average relative density value of the resulting sintered compact was high, 96.6%, to suppress the density variation in in-plane distribution to 0.2% or less. Although it is not shown in drawings, no specific abnormality was observed in the appearance of the sintered compact. Furthermore, the surface of the sintered compact was ground, and the resistivity on a surface was measured by a four-terminal method and was found to be 1.5 mΩ·cm. Thus, favorable electrical conductivity was obtained.

Example 5

The pulverized $NbO_2$ powder obtained in Example 1 was sintered by hot pressing at 1060° C. to produce a sintered compact having a diameter of 460 mm. As a result, the average relative density value of the resulting sintered compact was high, 97.1%, to suppress the density variation in in-plane distribution to 0.5% or less. Although it is not shown in drawings, no specific abnormality was observed in the appearance of the sintered compact. Furthermore, the surface of the sintered compact was ground, and the resistivity on a surface was measured by a four-terminal method and was found to be 2.1 mΩ·cm. Thus, favorable electrical conductivity was obtained.

Example 6

The pulverized $NbO_2$ powder obtained in Example 1 was sintered by hot pressing at 950° C. to produce a sintered compact having a diameter of 460 mm. As a result, the average relative density value of the resulting sintered compact was high, 95.2%, to suppress the density variation in in-plane distribution to 0.5% or less. Although it is not shown in drawings, no specific abnormality was observed in the appearance of the sintered compact.

Example 7

The pulverized $NbO_2$ powder obtained in Example 2 was sintered by hot pressing at 1050° C. to produce a sintered compact having a diameter of 460 mm. As a result, the average relative density value of the resulting sintered compact was high, 96.6%. Since the measurement of in-plane density distribution is a destructive test, this sintered compact was not evaluated. However, from the results in Examples 3, 4, 5, and 6, the in-plane distribution can be expected to have a density variation of 0.5% or less. Subsequently, this sintered compact was processed into a disk shape having a diameter of 425 mm and a thickness of 6.35 mm. It was further bonded to a backing plate made of oxygen-free copper with indium (In) solder. The resistivity of the $NbO_2$ surface was measured by a four-terminal method and was found to be 2.5 mΩ·cm. Thus, favorable electrical conductivity was obtained.

Comparative Example 1

Figure 4:
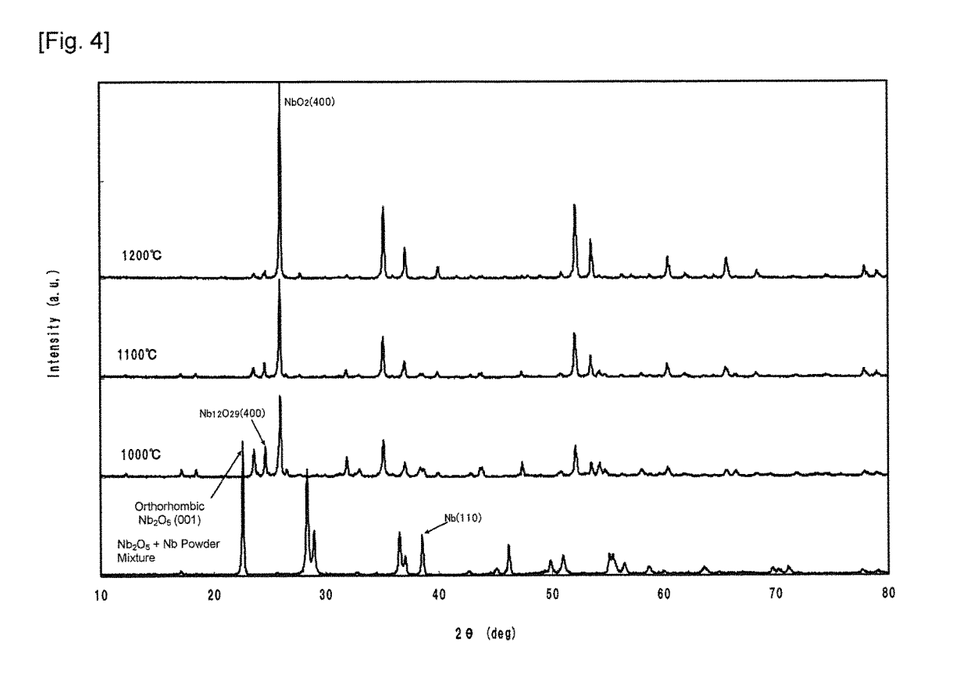
FIG. 4 is a graph showing XRD profiles of sintered compacts prepared from orthorhombic $Nb_2O_5$ and Nb by reaction sintering (upper stage: a sintering temperature of 1200° C., middle stage: a sintering temperature of 1100° C., lower stage: a sintering temperature of 1000° C., bottom stage: powder mixture of $Nb_2O_5$ and Nb).
Figure 5:
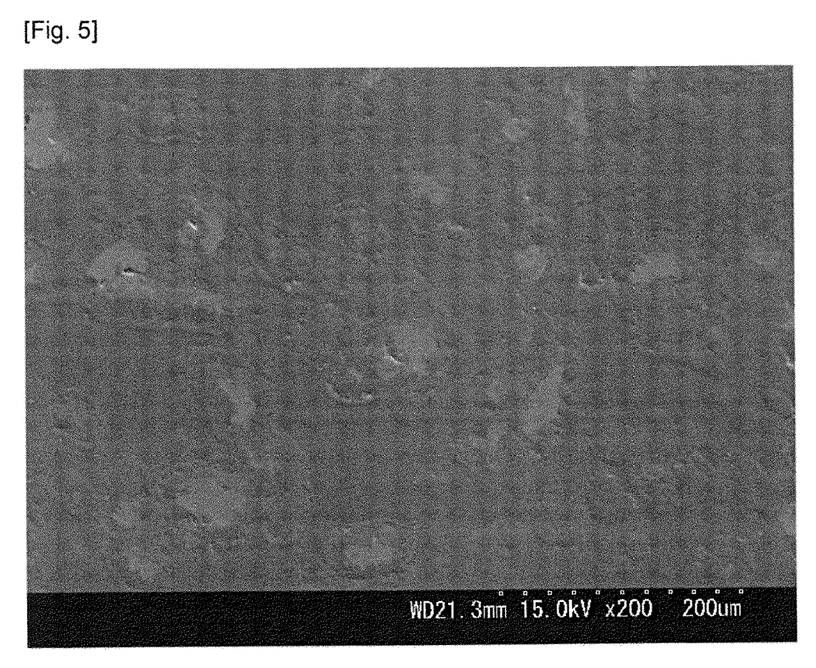
FIG. 5 is an image of SEM observation of a sintered compact of Comparative Example 1 prepared by reaction sintering from $Nb_2O_5$ and Nb at 1000° C.

A $Nb_2O_5$ powder having a purity of 99.9% and a Nb powder having a purity of 99.9% were mixed. The mixture was subjected to reaction sintering that simultaneously performs synthesis and sintering. The reaction sintering was performed using a hot press at a hot-pressing temperature of 1000° C. to give a diameter of 30 mm and a thickness of 9 mm. FIG. 5 shows an image of SEM observation of the surface of the resulting sintered compact. The result demonstrated that materials (light gray portion) other than $NbO_2$ remained. The surface of the sintered compact was inspected by X-ray diffraction analysis. As a result, as shown in the lower stage of FIG. 4, peaks of Nb, $Nb_{12}O_{29}$ as an intermediate during the synthesis, and so on were observed. Thus, the synthesis of $NbO_2$ was incomplete in Comparative Example 1.

Comparative Example 2

Figure 6:
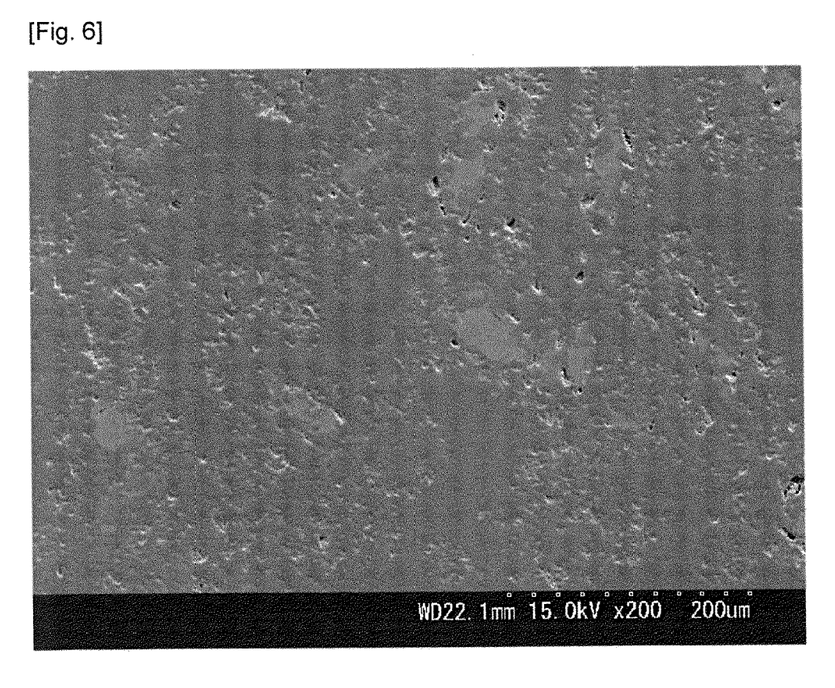
FIG. 6 is an image of SEM observation of a sintered compact of Comparative Example 2 prepared by reaction sintering from $Nb_2O_5$ and Nb at 1100° C.

A sintered compact was produced by reaction sintering as in Comparative Example 1 except that the hot-pressing temperature was 1100° C. FIG. 6 shows an image of SEM observation of the surface of the resulting sintered compact. The result demonstrated that materials (light gray portion) other than $NbO_2$ remained and that pores were formed in the periphery of the metal Nb. The surface of the sintered compact was inspected by X-ray diffraction analysis. As a result, as shown in the middle stage of FIG. 4, peaks of Nb, $Nb_{12}O_{29}$ as an intermediate during the synthesis, and so on were observed. Thus, the synthesis of $NbO_2$ was incomplete in Comparative Example 2.

Comparative Example 3

Figure 7:
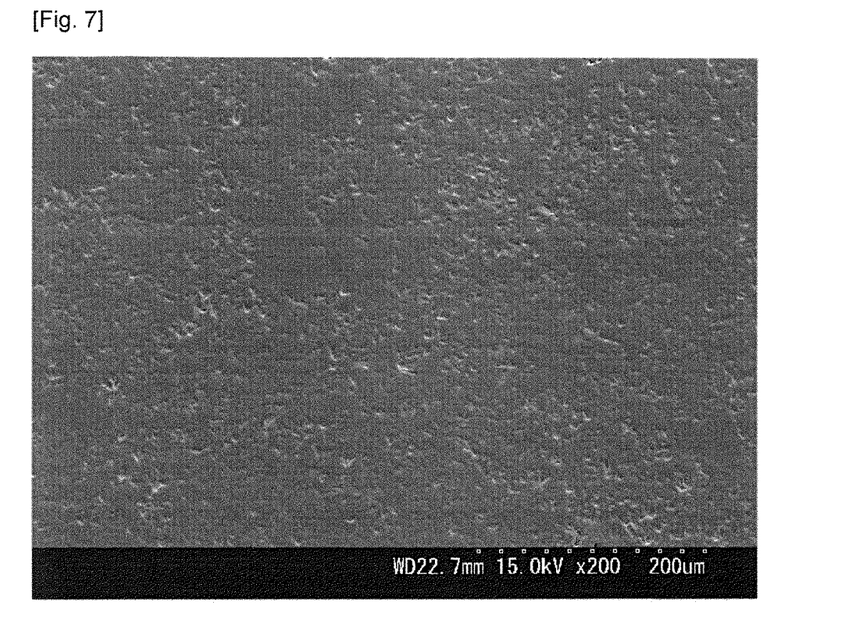
FIG. 7 is an image of SEM observation of a sintered compact of Comparative Example 3 prepared by reaction sintering from $Nb_2O_5$ and Nb at 1200° C.

A sintered compact was produced as in Comparative Example 1 except that the hot-pressing temperature was 1200° C. FIG. 7 shows an image of SEM observation of the surface of the resulting sintered compact. The result demonstrated that a large number of pores were formed in the periphery of the metal Nb. The surface of the sintered compact was inspected by X-ray diffraction analysis. As a result, as shown in the upper stage of FIG. 4, peaks of Nb, $Nb_{12}O_{29}$ as an intermediate during the synthesis, and so on were observed. Thus, the synthesis of $NbO_2$ was incomplete in Comparative Example 3.

Comparative Example 4

Figure 9:
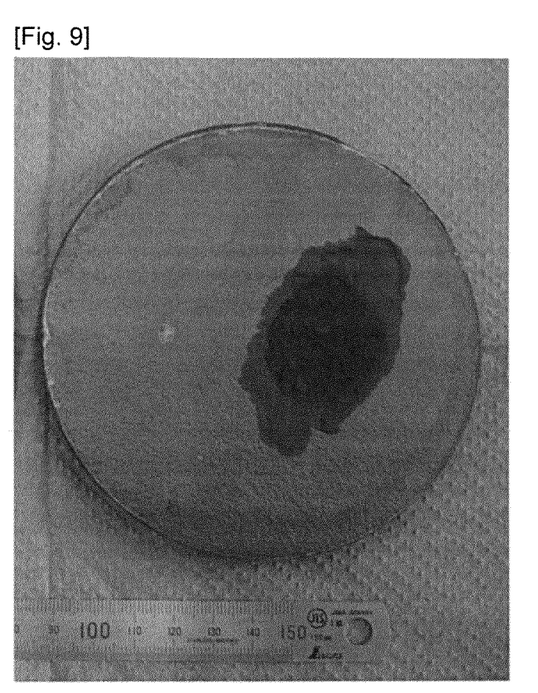
FIG. 9 is a photograph of the appearance of a sintered compact (diameter: 110 mm) of Comparative Example 4 (hot pressing at 1300° C.).

The pulverized $NbO_2$ powder obtained in Example 1 was sintered by hot pressing at 1300° C. to produce a sintered compact having a diameter of 110 mm. As a result, the average relative density value of the resulting sintered compact was significantly low, 85.0%, and the density variation in in-plane distribution was deteriorated to 6.1%. In addition, as shown in FIG. 9, the central portion was cracked to form a depression observed in the appearance of the sintered compact. This cracking is believed to be caused by occurrence of gas (emission gas) during the sintering.

Comparative Example 5

Figure 8:
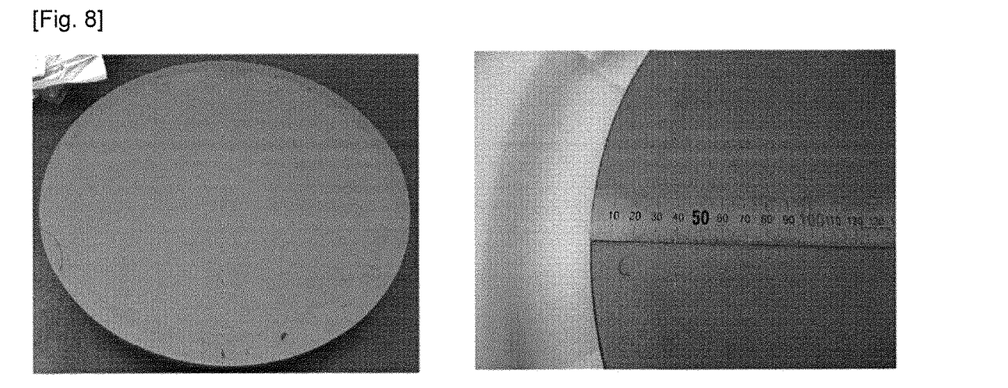
FIG. 8 is a photograph of the appearance of a sintered compact (diameter: 460 mm) of Comparative Example 5 (hot pressing at 1300° C.).

The pulverized $NbO_2$ powder obtained in Example 1 was sintered by hot pressing at 1300° C. to produce a sintered compact having a diameter of 460 mm. As a result, the average relative density value of the resulting sintered compact was significantly low, 79.5%, and the density variation in in-plane distribution was deteriorated to 3.1%. In addition, as shown in FIG. 8, the central portion was cracked to form a depression observed in the appearance of the sintered compact. This cracking is believed to be caused by occurrence of gas (emission gas) during the sintering.

Comparative Example 6

The pulverized $NbO_2$ powder obtained in Example 1 was sintered by hot pressing at 900° C. to produce a sintered compact having a diameter of 110 mm. As a result, though the density variation in in-plane distribution of the resulting sintered compact was low, 0.9%, the average relative density value was significantly low, 88.6%. Thus, when the hot-pressing temperature was low, though there was no problem in the in-plane density distribution, the density was low, resulting in insufficient sintering.

The $NbO_2$ sintered compact of the present invention can be used in a sputtering target. The thin film formed using this sputtering target is useful as a high-quality variable resistance layer that is used in a ReRAM. Another notable characteristic of the present invention is that a single phase $NbO_2$ sintered compact having a high density can be obtained without using any expensive material, which allows stable sputtering and is very useful for the promotion of production efficiency in recent years.

The invention claimed is:

1. A $NbO_2$ sintered compact sputtering target, consisting essentially of single phase $NbO_2$ such that an intensity proportion of an X-ray diffraction peak intensity of a (001) plane or (110) plane of $Nb_2O_5$ relative to an X-ray diffraction peak intensity of a (400) plane of $NbO_2$ is 1% or less, an intensity proportion of an X-ray diffraction peak intensity of a (110) plane of Nb relative to the X-ray diffraction peak intensity of a (400) plane of $NbO_2$ is 1% or less, and an X-ray diffraction peak intensity of a (400) plane of $Nb_{12}O_{29}$ relative to the X-ray diffraction peak intensity of a (400) plane of $NbO_2$ is 5% or less, wherein the sputtering target has a relative density is 95% or more and a surface having a resistivity of 100 mΩ·cm or less.

2. The $NbO_2$ sintered compact sputtering target according to claim 1, wherein the density variation between arbitrary two points in a plane of the sintered compact sputtering target is 1.0% or less.

3. The $NbO_2$ sintered compact sputtering target according to claim 2, having a diameter of 110 mm or more.

4. The sputtering target according to claim 3, wherein the sputtering target is bonded to a backing plate made of oxygen-free copper, chromated copper, or zincated copper with an indium solder.

5. A method of producing the $NbO_2$ sintered compact sputtering target according to claim 1, comprising the steps of:
    mixing a $Nb_2O_5$ powder and a Nb powder;
    heating the resulting mixture at 1300° C. to 1400° C. in vacuum or in an inert atmosphere to synthesize $NbO_2$;
    pulverizing the synthesized $NbO_2$; and
    sintering the pulverized powder by hot pressing at 950° C. to less than 1300° C.

6. The method according to claim 5, wherein the pulverized powder of the synthesized $NbO_2$ is sintered by hot pressing at 950° C. to 1100° C.

7. The method according to claim 6, wherein the $Nb_2O_5$ powder has a purity of 99.9% or more, and the Nb powder has a purity of 99.9% or more.

8. The method according to claim 7, wherein the $Nb_2O_5$ powder has an orthorhombic or monoclinic crystal system.

9. The method according to claim 5, wherein the $Nb_2O_5$ powder has a purity of 99.9% or more, and the Nb powder has a purity of 99.9% or more.

10. The method according to claim 5, wherein the $Nb_2O_5$ powder has an orthorhombic or monoclinic crystal system.

11. The $NbO_2$ sintered compact sputtering target according to claim 1, having a diameter of 110 mm or more.

12. The sputtering target according to claim 11, wherein the sputtering target is bonded to a backing plate made of oxygen-free copper, chromated copper or zincated copper with an indium solder.

13. The $NbO_2$ sintered compact sputtering target according to claim 1, wherein the intensity proportion of an X-ray diffraction peak intensity of the (110) plane of Nb relative to the X-ray diffraction peak intensity of the (400) plane of $NbO_2$ is 0.1% to 0.4%, and the X-ray diffraction peak intensity of the (400) plane of $Nb_{12}O_{29}$ relative to the X-ray diffraction peak intensity of the (400) plane of $NbO_2$ is 1.7% to 4.6%.

* * * * *